(12) United States Patent
Ayazi et al.

(10) Patent No.: US 7,843,284 B2
(45) Date of Patent: Nov. 30, 2010

(54) LITHOGRAPHICALLY DEFINED MULTI-STANDARD MULTI-FREQUENCY HIGH-Q TUNABLE MICROMECHANICAL RESONATORS

(75) Inventors: Farrokh Ayazi, Atlanta, GA (US); Gavin Kar-Fai Ho, Cambridge, MA (US); Reza Abdolvand, Stillwater, OK (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 12/618,368

(22) Filed: Nov. 13, 2009

(65) Prior Publication Data

US 2010/0066467 A1 Mar. 18, 2010

(51) Int. Cl.
*H03H 9/00* (2006.01)
*H03H 9/17* (2006.01)
(52) U.S. Cl. ........................................ 333/186; 333/197
(58) Field of Classification Search .................. 333/186, 333/187, 189, 191, 197
See application file for complete search history.

(56) References Cited

U.S. PATENT DOCUMENTS

| | | | |
|---|---|---|---|
| 4,013,983 A | | 3/1977 | Hartemann |
| 5,640,133 A | * | 6/1997 | MacDonald et al. ........ 333/197 |
| 7,492,241 B2 | * | 2/2009 | Piazza et al. ................ 333/189 |
| 2008/0079515 A1 | * | 4/2008 | Ayazi et al. ................ 333/187 |
| 2009/0072663 A1 | * | 3/2009 | Ayazi et al. ................ 310/320 |

* cited by examiner

*Primary Examiner*—Dean O Takaoka
(74) *Attorney, Agent, or Firm*—Myers Bigel Sibley & Sajovec, P.A.

(57) ABSTRACT

Disclosed are micromechanical resonator apparatus having features that permit multiple resonators on the same substrate to operate at different operating frequencies. Exemplary micromechanical resonator apparatus includes a support substrate and suspended micromechanical resonator apparatus having a resonance frequency. In one embodiment, the suspended micromechanical resonator apparatus comprises a device substrate that is suspended from and attached to the support substrate, a piezoelectric layer formed on the suspended device substrate, and a plurality of interdigitated upper electrodes formed on the piezoelectric layer. In another embodiment, the suspended micromechanical resonator apparatus comprises a device substrate that is suspended from and attached to the support substrate, a lower electrode formed on the suspended device substrate, a piezoelectric layer formed on the lower electrode, and a plurality of interdigitated upper electrodes formed on the piezoelectric layer. The substrate may comprise a silicon substrate, or a semiconductor-on-insulator substrate, such as a diamond on silicon substrate. Additionally, lateral frequency-adjusting electrodes may be disposed adjacent to the resonator apparatus that are separated therefrom by a capacitive gap, and which are configured to receive a direct current voltage that adjusts the resonance frequency of the resonator apparatus.

11 Claims, 11 Drawing Sheets

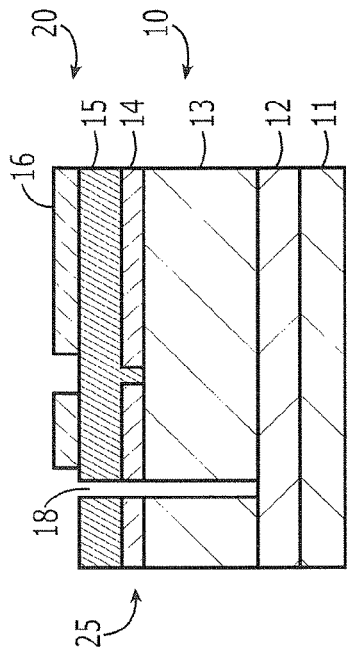
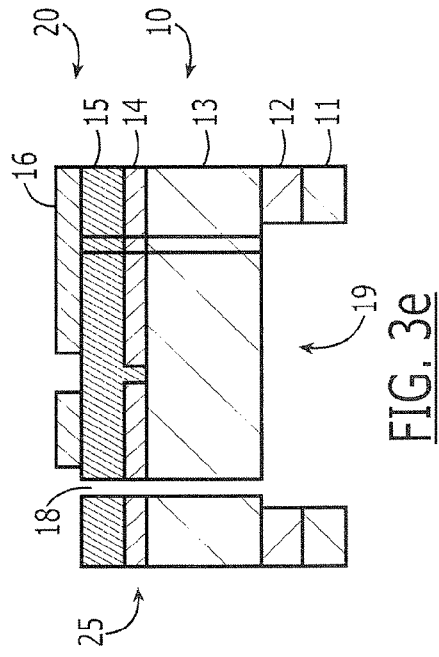
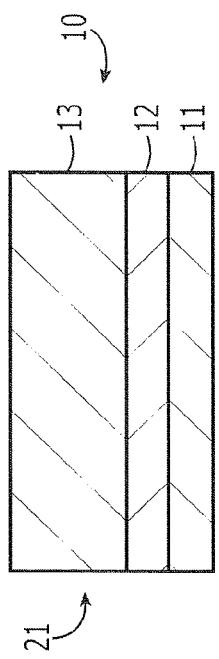
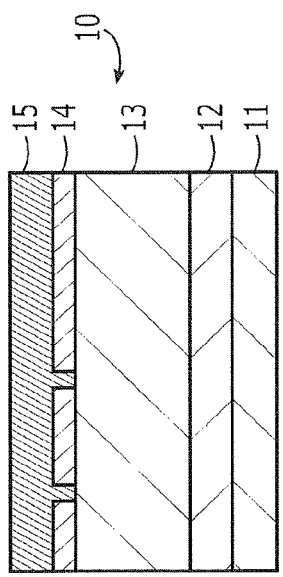
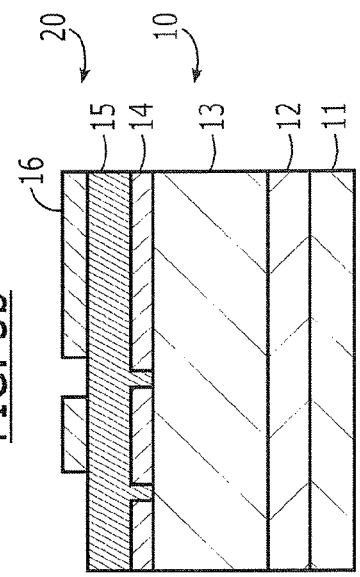

US 7,843,284 B2

LITHOGRAPHICALLY DEFINED MULTI-STANDARD MULTI-FREQUENCY HIGH-Q TUNABLE MICROMECHANICAL RESONATORS

GOVERNMENT RIGHTS

This invention was made with Government Support under contract/grant DAAH01-1-R004 awarded by the US Army Aviation and Missile Command. The Government has certain rights in the invention.

REFERENCE TO PRIORITY APPLICATION

This application claims priority to U.S. application Ser. No. 12/009,527, filed Jan. 18, 2008 now U.S. Pat. No. 7,639,105, which claims priority to U.S. Provisional Application Ser. No. 60/885,747, filed Jan. 19, 2007, the disclosures of which are hereby incorporated herein by reference.

BACKGROUND

The present invention relates generally to micromechanical resonators, and more particularly, to multi-frequency high-Q tunable micromechanical resonators.

In Asia, Europe, and North America, multiple frequency standards and infrastructures have been established with which cellular handsets must comply in order to provide connectivity for users. Thus, multi-band cellular handsets are required. Currently, the frequency standards in use are nominally 850, 900, 1800, and 1900 MHz. The latest technology also requires filters at 2.4 GHz and 5 GHz. Although purely digital WCDMA networks are evolving across the globe, analog protocols at 850 and 900 MHz must also be supported for connectivity is less-developed areas. In the United States, the FCC mandates freeing the currently occupied 300-800 MHz analog (video) broadcast bands may enable mobile communications over this spectrum. For these reasons, cellular handsets will also require analog band and low-UHF compliance for years to come.

Piezoelectric thin film resonators, which can be subcategorized into solidly mounted resonators and film bulk acoustic resonators, have been proposed for traditional surface acoustic wave filter replacement. However, since thin film resonators utilize the thickness dilation of a thin deposited film, obtaining resonators with widely dispersed frequencies would typically require film deposition at multiple thicknesses. The piezoelectric films are typically sandwiched on both sides with metal electrodes. One technique to provide frequency variance, although difficult to implement, is provided by selective deposition of metal electrodes. However, obtaining the 2:1 frequency ratio between 900 MHz and 1800 MHz is not feasible.

Independent groups have demonstrated bandpass filters at 900 MHz and 1900 MHz using thin film resonators. The 1900 MHz film bulk acoustic resonator filters, which are integrated with electronics, are currently in production for handsets which use a US-based PCS network. However, filter solution at multiple frequencies on a single die or single package are not known to exist. For this reason, single-chip integrated thin film resonator-based bandpass filters have not penetrated markets that utilize multiple frequency standards such as Asia and Europe.

With increasing demand for higher level of integration in existing electronic systems and emerging applications, alternatives to bulky frequency selective components and resonant sensors are necessary. Micromechanical resonators are choice candidates owing to their small size and ease of integration. Several demonstrations of capacitively transduced, silicon micromechanical resonators with high Q have been demonstrated. Typical capacitive UHF resonators require large polarization voltages and ultra-thin electrode-to-resonator gap spacing to achieve motional impedances ($R_1$) less than 1 kohm. These two requirements pose additional demands on resonator fabrication and interface circuits. In contrast, piezoelectric resonators can be fabricated with relative ease using low temperature processes and have lower R.sub.1 due to greater coupling.

Examples of piezoelectric resonators include quartz crystal units, surface acoustic wave (SAW) resonators and thin-film bulk acoustic resonators (FBAR). The main drawbacks of crystal units and SAW devices are their bulky size and incompatibility for microelectronic integration. On the other hand, FBARs can be integrated with on-chip electronics and have been demonstrated at GHz frequencies. Since FBARs utilize the thickness vibration of a thin film, obtaining multiple dispersed frequency standards on a single substrate is challenging.

It would be desirable to have multi-frequency high-Q tunable micromechanical resonators for use in multi-band cellular handsets, and the like. It would also be desirable to have composite bulk acoustic resonators implement dispersed-frequency devices simultaneously on a single substrate.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 3a-3e illustrate an exemplary fabrication process flow for fabricating composite bulk acoustic resonators;

DETAILED DESCRIPTION

Figure 1:
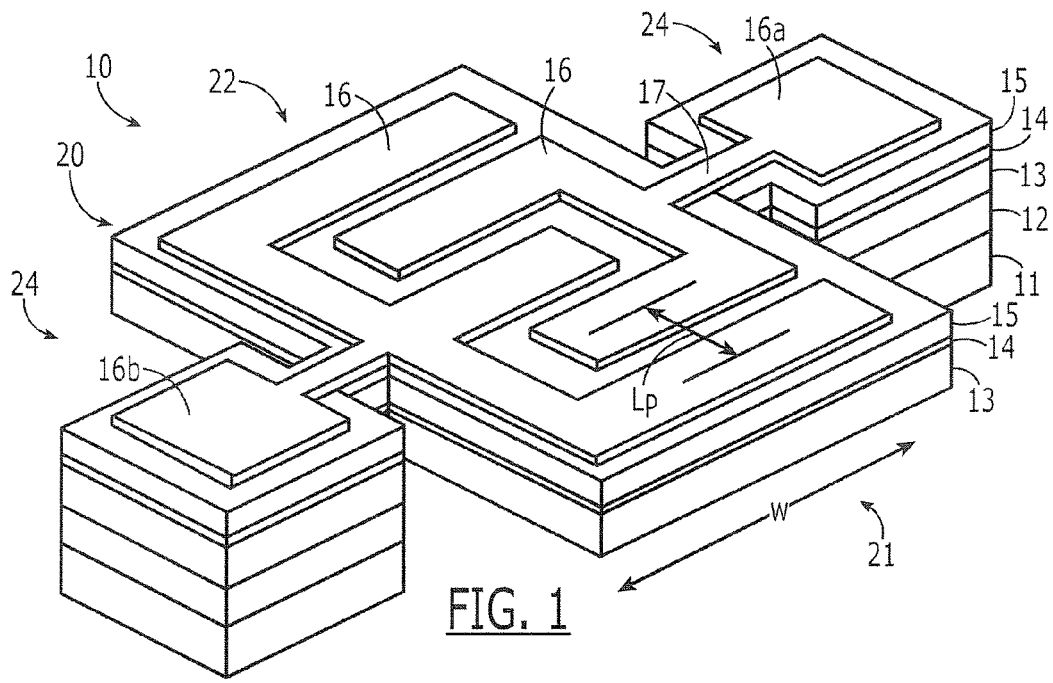
FIG. 1 shows the structure of an exemplary composite bulk acoustic resonator.

Referring to the drawing figures, disclosed are multi-frequency micromechanical resonator 10 that simultaneously implements UHF resonators and filters with widely-dispersed frequencies while having the same piezoelectric film thickness.

More particularly, lateral and thickness mode low-impedance UHF resonators 10 are disclosed that implement dispersed-frequency devices simultaneously on a single support substrate 11 (FIGS. 1, 3). The low-impedance is enabled by using high-order modes of resonators 10 comprising a piezoelectric transduction film 20 or piezoelectric transduction stack 20 formed on an underlying device layer 13. The device substrate comprises of device layer 13 and may also comprise of an insulator layer 12. The impedance of these devices reduces as mode number increases. This is attributed to the increase in transduction area. The lowest measured impedance for a currently-reduced-to-practice resonators 10 is 55 ohms at 373 MHz. Reduced-to-practice resonators 10 with 373 MHz and 640 MHz lateral modes and 2.5 GHz thickness modes from the same substrate 10 are disclosed.

U.S. Pat. No. 6,909,221 assigned to the assignee of the present invention describes the basic structure and fabrication methods relating to piezoelectric on semiconductor-on-insulator microelectromechanical resonators, and in particular, generally describes bulk mode resonators and their fabrication. The contents of U.S. Pat. No. 6,909,221 are incorporated herein by reference in its entirety. The presently disclosed multi-frequency micromechanical resonators 10 improve upon the teachings contained in U.S. Pat. No. 6,909,221.

Described herein are exemplary UHF composite piezoelectrically transduced single-crystal-silicon (SCS) resonators 10 operating in lateral bulk acoustic modes that alleviate the constraints discussed in the Background section. A distinctive aspect of the resonators 10 lies in the use of thin-film piezoelectric material primarily for transduction of the resonator 10. An exemplary high order composite bulk acoustic resonator (CBAR) is shown in FIG. 1. The exemplary composite bulk acoustic resonator 10 comprises a frequency-defined silicon structure 21 and a transduction stack 20 comprising two-metal layers 14, 16 and a piezoelectric film 15 disposed therebetween. Although the composite bulk acoustic resonator 10 resembles the interdigitated layout of a SAW transducer, its mode is in bulk acoustic form. The term "bulk" is used to signify energy storage in the bulk of the structure, instead of the definition that the mode is present in a bulk material.

Figure 2:
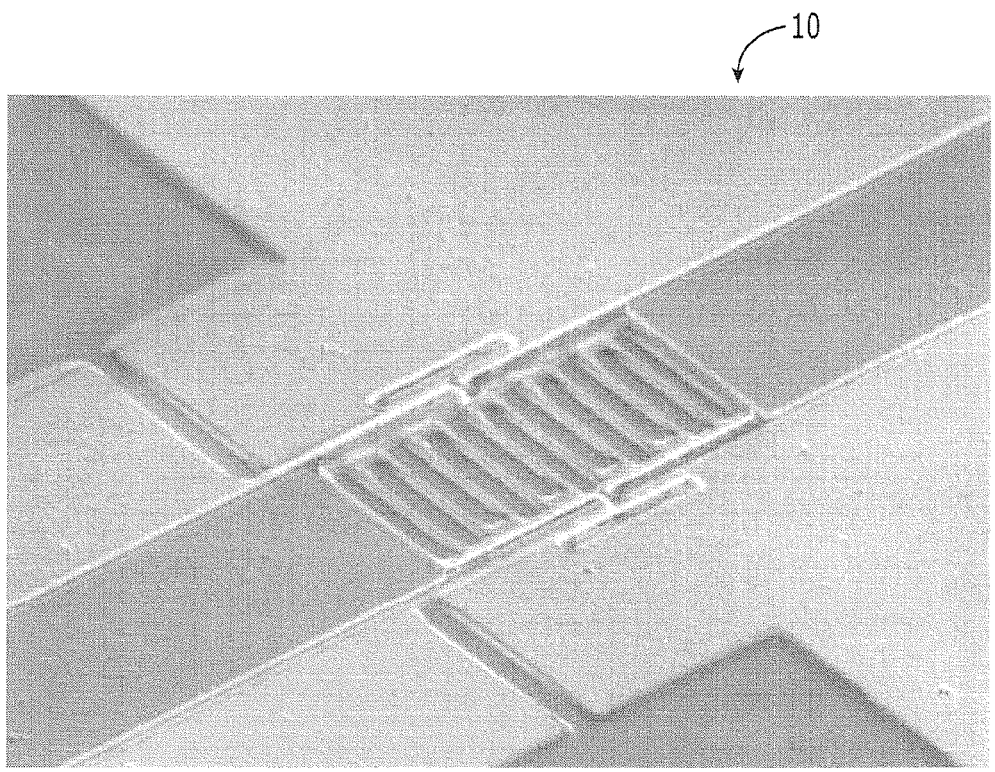
FIGS. 2 and 2a are scanning electron microscope (SEM) views of exemplary reduced-to-practice composite bulk acoustic resonators.
Figure 2A:
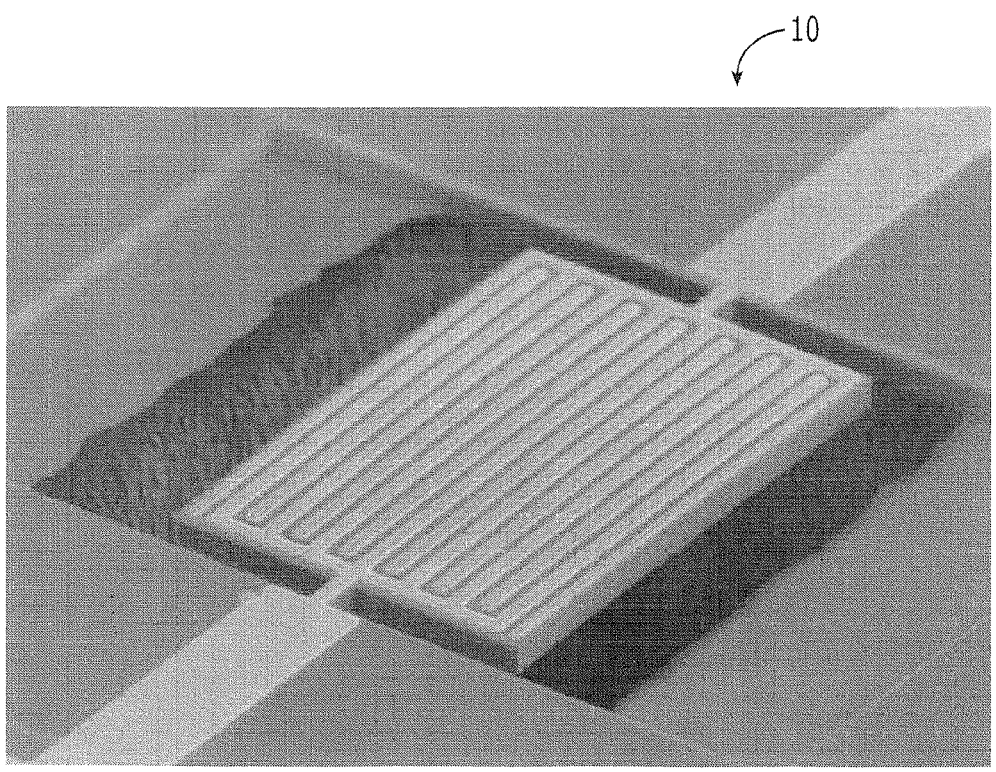

More particular, FIG. 1 shows the structure of the exemplary composite bulk acoustic resonator 10. The exemplary resonator 10 comprises a substrate 21 (silicon structure 21), which may be a single crystal silicon (SCS) substrate 21 or a silicon-on-insulator (SOI) substrate 21 (i.e., a semiconductor-on-insulator substrate 21). The resonator 10 specifically shown in FIG. 1 comprises a silicon-on-insulator (SOI) substrate 21, which has a lower handle silicon layer 11, a buried oxide layer 12 (silicon oxide) formed on the handle silicon layer 11, and an upper silicon device layer 13 formed on the buried oxide layer 12. However, the substrate 21 may comprise a semiconductor-on-insulator substrate 21, such as a diamond on silicon substrate 21, for example. In general, the substrate 21 may comprise a material selected from a group including diamond, nanocrystalline diamond, silicon carbide, silicon-germanium, gallium arsenide or metal. Furthermore, only the most relevant portion of the resonator 10 is shown, and the substrate 21 actually extends laterally away from the structure that is shown, such as is shown in FIGS. 2 and 2a, for example.

Resonator apparatus 22 is formed on the silicon-on-insulator substrate 21. The resonator apparatus 22 comprises a piezoelectric stack 20 formed on top of the silicon device layer 13. The piezoelectric stack 20 comprises a lower conductive metal layer 14, which may be gold, for example, formed on the silicon device layer 14. An oxide layer 15, such as zinc oxide, for example, is formed on the lower conductive metal layer 14. A plurality of interdigitated conductive electrodes 16, which may be aluminum, for example, are formed on the zinc oxide layer 15. The plurality of interdigitated conductive electrodes 16 are respectively coupled by way of tethers 17 to conductive pads 16a, which may be aluminum, for example, formed on the oxide layer 12. One conductive pad 16a comprises a excitation port 16a that is electrically insulated from the substrate 21, and another conductive pad 16b comprises a sense port 16b that is electrically insulated from the substrate 21. The handle silicon layer 11, and buried oxide layer 12 are removed from beneath the device silicon layer 13 and piezoelectric stack 20 in order to release the resonator apparatus 22 and allow it to resonate. The conductive pads 16a, 16b and the structure under them form anchors 24 that anchor the resonator apparatus 22 to the substrate 11.

There are several advantages of utilizing silicon as a structural material, i.e., the substrate 21. The properties of single crystal silicon are stable and well-characterized to enable design for manufacturability. In addition, single crystal silicon has low acoustic loss and an energy density much greater than that of quartz for high Q and good linearity. The anisotropic properties of silicon provide clean mode shapes that lead to good piezoelectric coupling for low $R_1$. Silicon also provides increased structural integrity to produce a relatively large suspended composite bulk acoustic resonator 10 as is shown in FIGS. 2 and 2a.

Figure 1A:
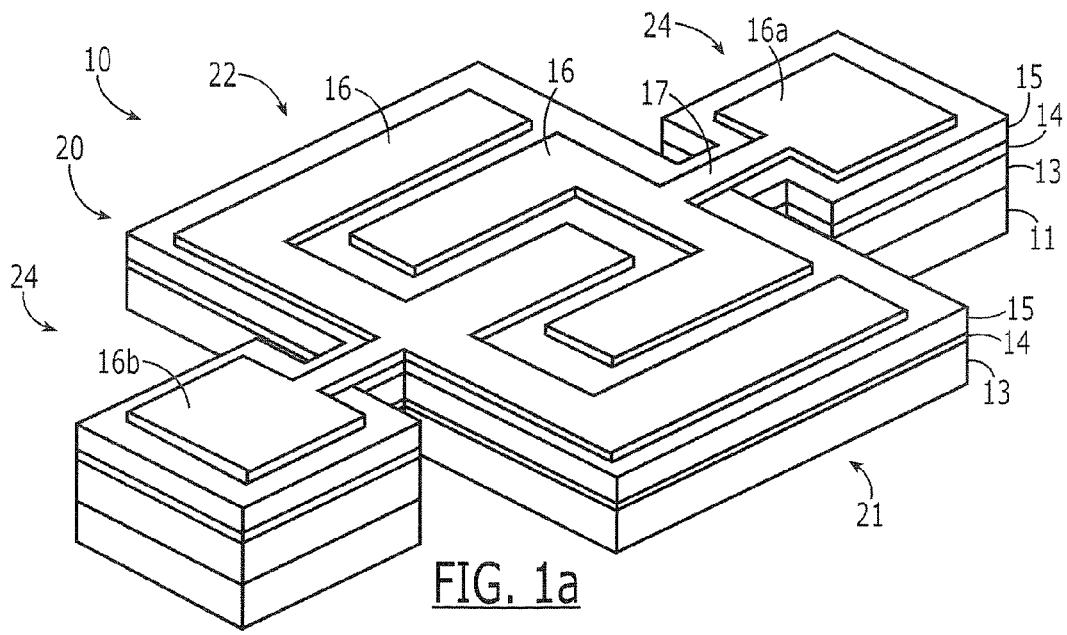
FIG. 1a shows the structure of a second exemplary composite bulk acoustic resonator.

FIG. 1a shows the structure of a second exemplary composite bulk acoustic resonator 10. The second exemplary composite bulk acoustic resonator 10 has a structure that is substantially the same as the resonator 10 shown in FIG. 1, but the substrate 21 comprises a semiconductor-on-insulator substrate 21, such as a diamond on silicon substrate 21, for example. Thus, while the substrate 10 shown in FIG. 1 has a lower handle silicon layer 11, a buried oxide layer 12 and an upper silicon device layer 13, the substrate 10 shown in FIG. 1a has a lower handle silicon layer 11 and an upper semiconductor (diamond) layer 13.

Figure 1B:
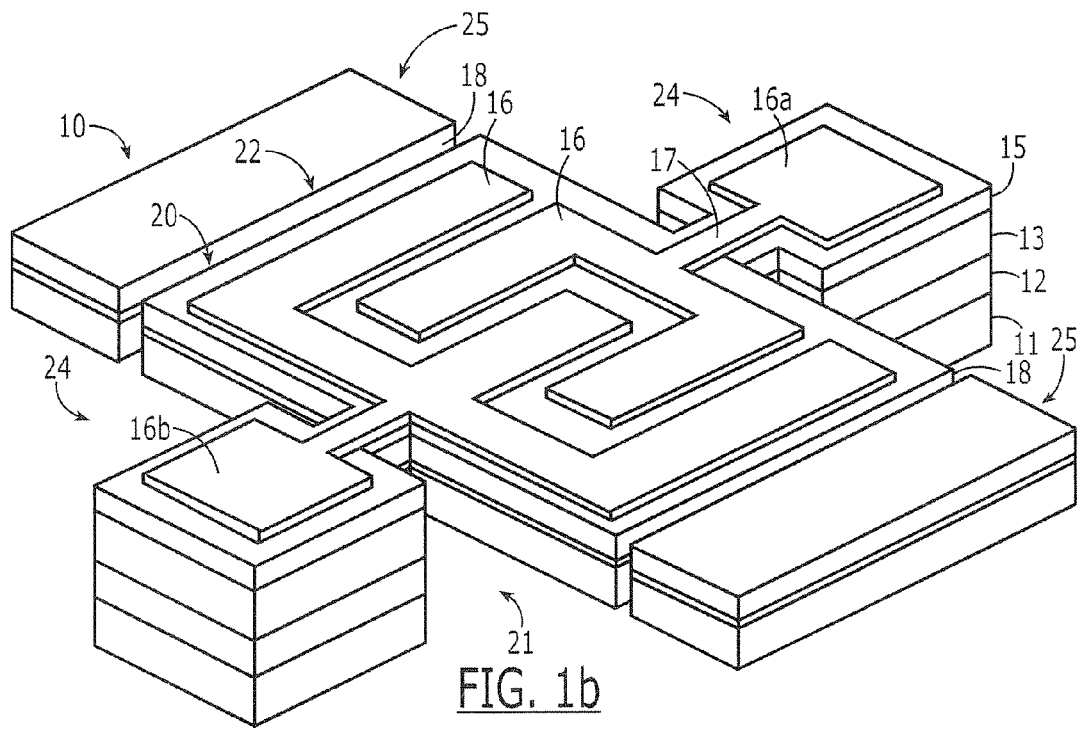
FIG. 1b shows the structure of a third exemplary composite bulk acoustic resonator.

FIG. 1b shows the structure of a third exemplary composite bulk acoustic resonator 10. The third exemplary composite bulk acoustic resonator 10 has a structure that is substantially the same as the resonator 10 shown in FIG. 1, but additionally has a plurality of frequency-adjusting electrodes 25 formed adjacent to sides of the resonator apparatus 22 and which are separated from the resonator apparatus 22 by capacitive gaps 18. The frequency-adjusting electrodes 25 allow a direct current (DC) voltage to be applied to the resonator apparatus 22 which adjusts the resonance frequency of the resonator apparatus 22.

Figure 1C:
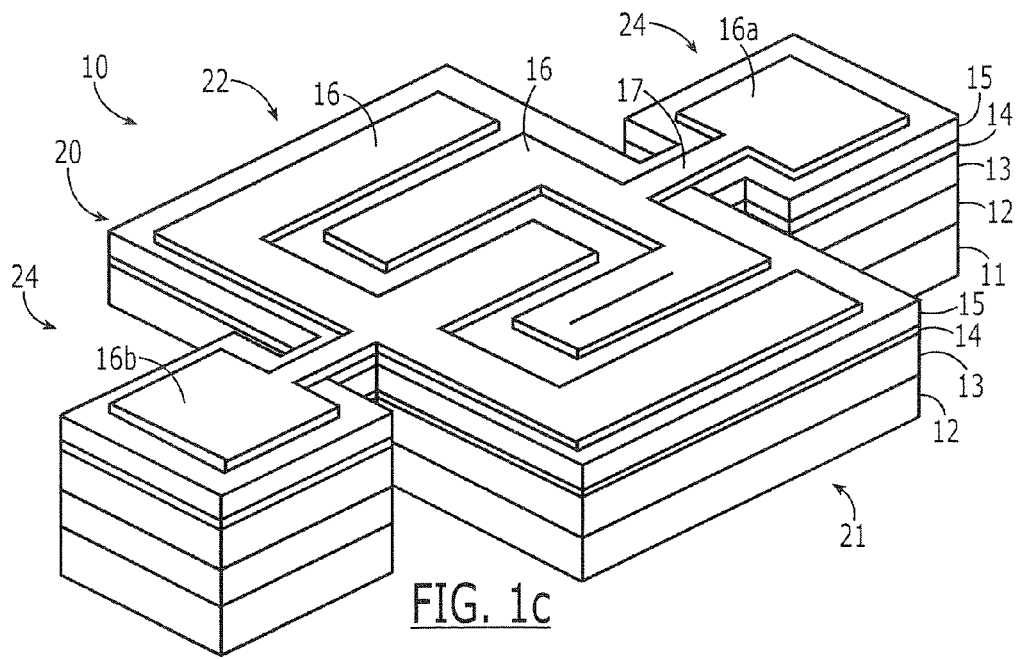
FIG. 1c shows the structure of a fourth exemplary composite bulk acoustic resonator.

FIG. 1c shows the structure of a fourth exemplary composite bulk acoustic resonator 10. The fourth exemplary composite bulk acoustic resonator 10 has a structure that is substantially the same as the resonator 10 shown in FIG. 1, but the buried oxide layer 12 (silicon oxide) is present under the upper silicon device layer 13.

FIGS. 2 and 2a are scanning electron microscope (SEM) views of exemplary reduced-to-practice composite bulk acoustic resonators 10. FIG. 2 shows the first reduced-to-practice composite bulk acoustic resonator 10 produced by the present inventors. FIG. 2a shows an exemplary 640 MHz composite bulk acoustic resonator 10 having a length of 75 µm and a width of 80 µm.

In order to implement the multi-frequency aspects of the resonator 10, the piezoelectric film 20 has a single thickness (i.e., substantially the same thickness throughout its extent). The resonator apparatus 22 thus has a lithographically-defined resonant frequency. The plurality of interdigitated electrodes 16 are configured so that they excite predetermined lateral resonating modes in the piezoelectric film 20. The resonator apparatus 22 operates in a bulk acoustic resonant mode.

The currently used fabrication process for producing the composite bulk acoustic resonator 10 uses five masks, as illustrated in the flow diagrams shown in FIGS. 3a-3e. The SOI substrate 21 may have a high-resistivity since a bottom metal electrode 14 is utilized. In producing an exemplary composite bulk acoustic resonator 10, the bottom metal electrode 14 may comprise a 100 Å chromium adhesion layer and a 1000 Å gold film that are evaporated and patterned. Next, a 0.5-1 µm thick zinc oxide film 15 is sputtered. Gold was selected for the bottom metal electrode 14 because it provided the best zinc oxide film 15. Next, a 1000 Å aluminum film is evaporated and patterned as the top electrode 16. Openings 18 or gaps 18 are etched in the zinc oxide film 20 to access the bottom metal electrode 14. Then, the structure of the resonator apparatus 22 is defined by etching through the zinc oxide film 20 and silicon device layer 13. Then, backside etching of the handle silicon layer 11 and buried oxide layer 12 is performed to form a backside cavity 19 to release the resonator apparatus 22. Using this process, resonators 10 having a relatively large area may be realized. Alternatively, other piezoelectric materials such as aluminum nitride (AlN) can be used in place of the zinc oxide. Molybdenum (Mo) or other metals can be used for the electrodes.

Fundamental Mode Composite Bulk Acoustic Resonators

Initial reduced-to-practice embodiments of composite bulk acoustic resonators 10 were beams and plates that showed equivalent resistances less than 2 kilo-ohms. This composite bulk acoustic resonator 10 has good linearity as the 1 dB compression point occurs for a 10 dBm input. The motional impedance of this resonator 10 is 450 ohms. Similar structures incorporating low-loss single crystal silicon exhibited quality factors up to 12000 in low vacuum.

Using an electrical-equivalent model of the fundamental-mode composite bulk acoustic resonator 10, the motional resistance is, $$R_1 \approx \frac{\pi(t_{Si} + t_f)\sqrt{E_i \rho}}{2d_{31}^2 E_f^2 wQ}$$

where $t_{Si}$ and $t_f$ are the thickness of the device layer 13 and piezoelectric film 20, respectively, $E_i$ and $\rho$ are the directional elasticity and mass density of silicon, $d_{31}$ and $E_f$ are the piezoelectric constant and elasticity of the piezoelectric film 20, w is the width of the electrode 16 (normal to the direction of motion), and Q is the quality factor. Of particular interest is that the length (and frequency) can be changed without affecting $R_1$. To reduce $R_1$, the easiest solution is to increase the width w of the electrode 16.

Higher Order Mode Composite Bulk Acoustic Resonators

Figure 4:
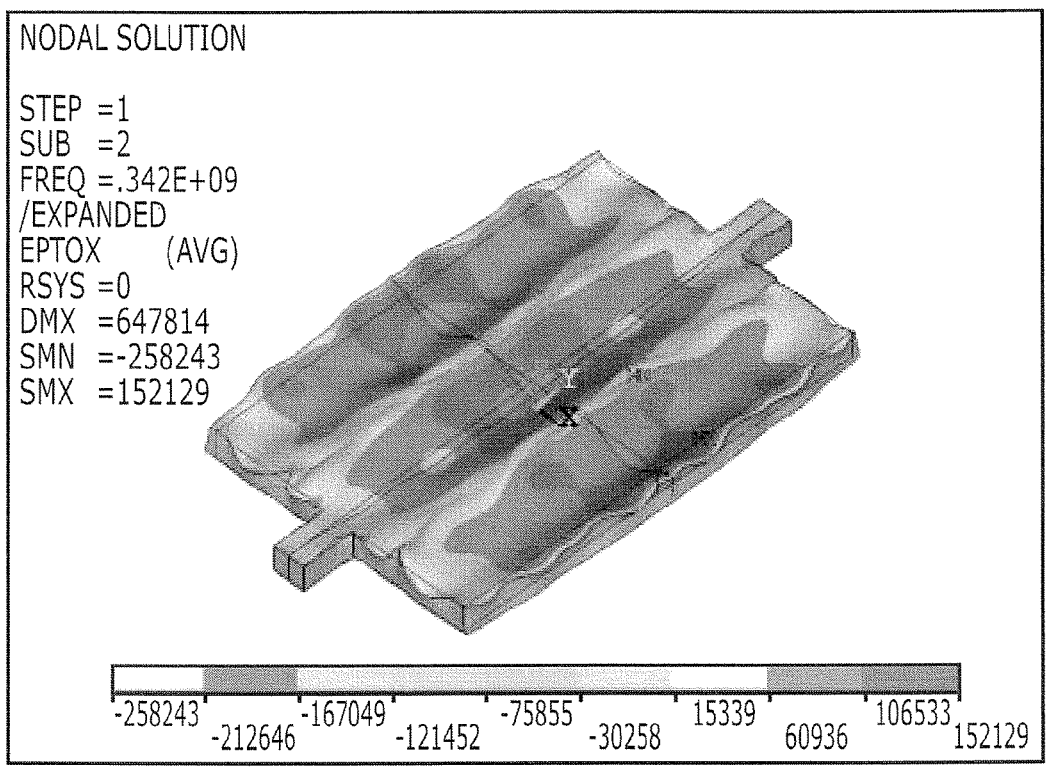
FIG. 4 shows a simulated mode-shape for an exemplary composite bulk acoustic resonator.

High-order modes are used to provide a further reduction in $R_1$ for RF applications. For an $n^{th}$-mode resonator 10, the transduction area is increased by a factor of n. The resonator 10 shown in FIG. 1 may be considered as a $5^{th}$-mode resonator 10 or simply a resonator 10 that is folded over five times. A simulated mode-shape shown in FIG. 4 illustrates regions with in-phase stress. Coupling efficiency is also determined by the mode shape. For an ideally-coupled resonator 10, the motional impedance is:

$$R_1 \approx \frac{n}{n^2 - 1} \frac{\pi(t_{Si} + t_f)\sqrt{E_i \rho}}{2d_{31}^2 E_f^2 wQ}$$

for odd n, when n>1. In addition to lower $R_1$, a high-order mode resonator 10 provides improved dimensional control. The frequency sensitivity to process variations is reduced by a factor of n in an $n^{th}$-mode resonator 10.

Figure 5:
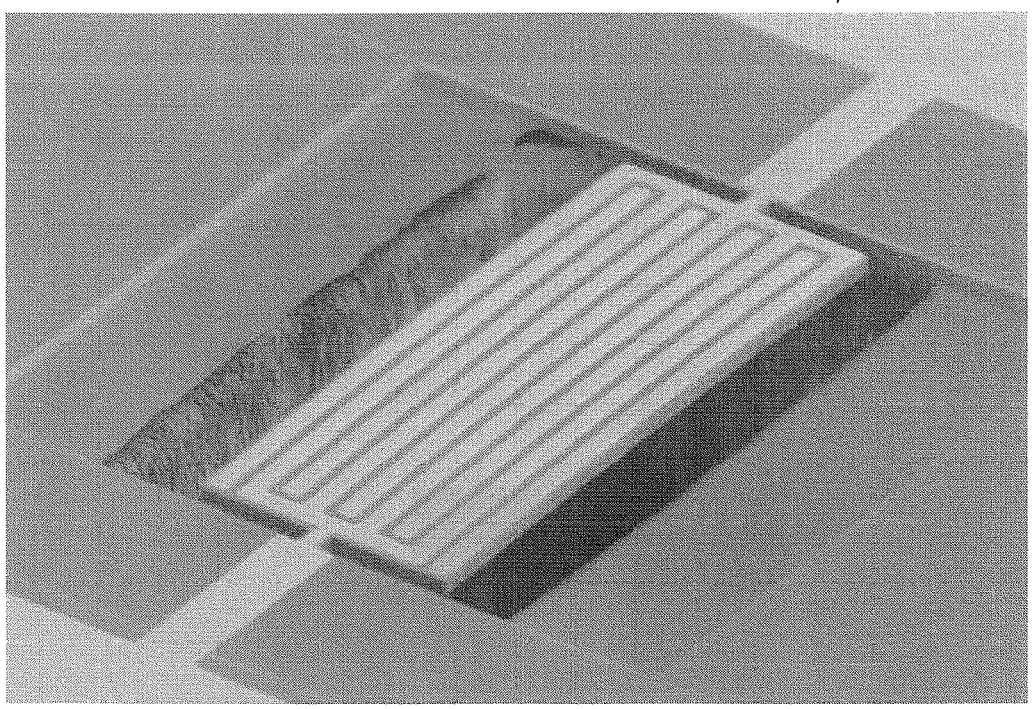
FIG. 5 is a scanning electron microscope (SEM) view of an exemplary 90 µm by 160 µm composite bulk acoustic resonator with $L_P$=10 µm.

The composite bulk acoustic resonator 10 shown in FIG. 5 is an exemplary device fabricated with the five mask process described with reference to FIGS. 3a-3e. It has a finger pitch of 10 µm and has lateral dimensions of 90 µm by 160 µm. With silicon providing structural integrity, devices wider than 300 µm have been fabricated without stress-related issues.

Resonators 10 were tested using a Suss RF probe station with an Agilent E5071B network analyzer at atmospheric pressure. SOLT calibration was performed using GSG probes. Two-port s-parameter measurements were taken, from which the motional impedance is:

$$R_1 = 2 \cdot R_L \left( \frac{1}{S_{21}} - 1 \right)$$

where $R_L$ is the termination impedance.

Figure 6:
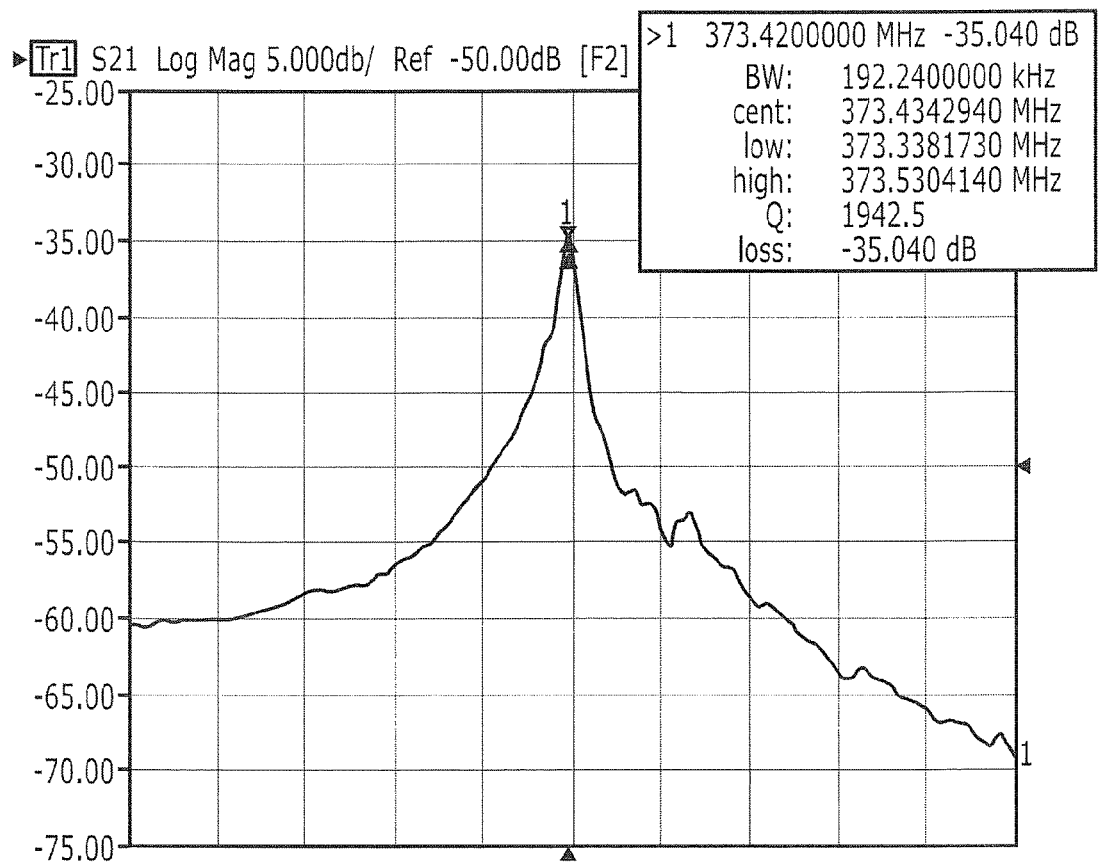
FIG. 6 is a graph showing frequency response of a 9th mode resonator with $L_p$=10 µm at 1 atm.
Figure 7:
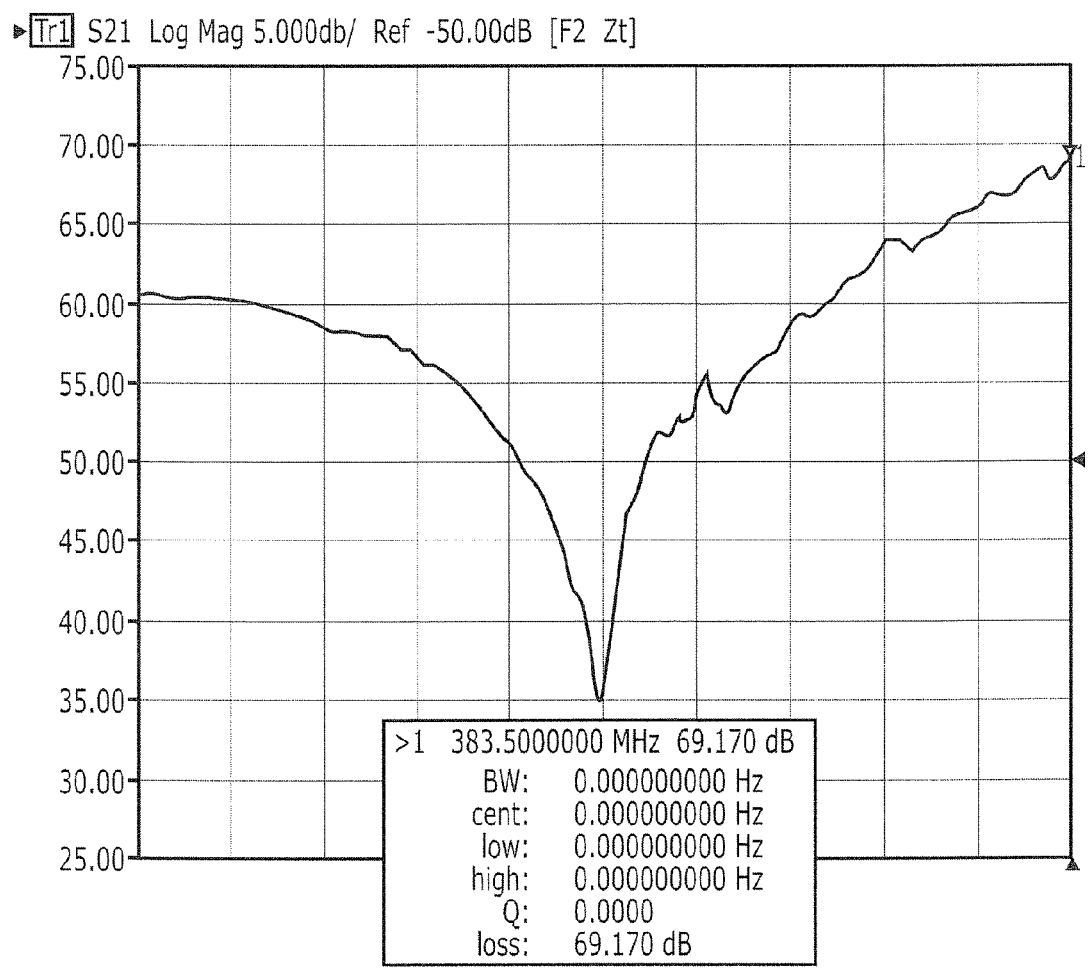
FIG. 7 is a graph showing the impedance of a $9^{th}$ mode resonator with $L_P$=10 µm at 1 atm.

The $9^{th}$-mode composite bulk acoustic resonator 10 shown in FIG. 5 has a resonance frequency of 373 MHz and exhibited an unloaded quality factor of 2000 at 1 atm, as is shown in the graph of FIG. 6. Higher Q is expected at lower pressures. To measure unloaded Q, the port conversion feature of the E5071B was utilized to simulate a termination of 0.5 ohms. The insertion loss of 35 dB at resonance corresponds to a 55 ohm device impedance. This is also verified by the 35 dBm impedance measurement (FIG. 7). The isolation level of 30 dB and the linear response with 10 dBm input are also remarkable.

Figure 8:
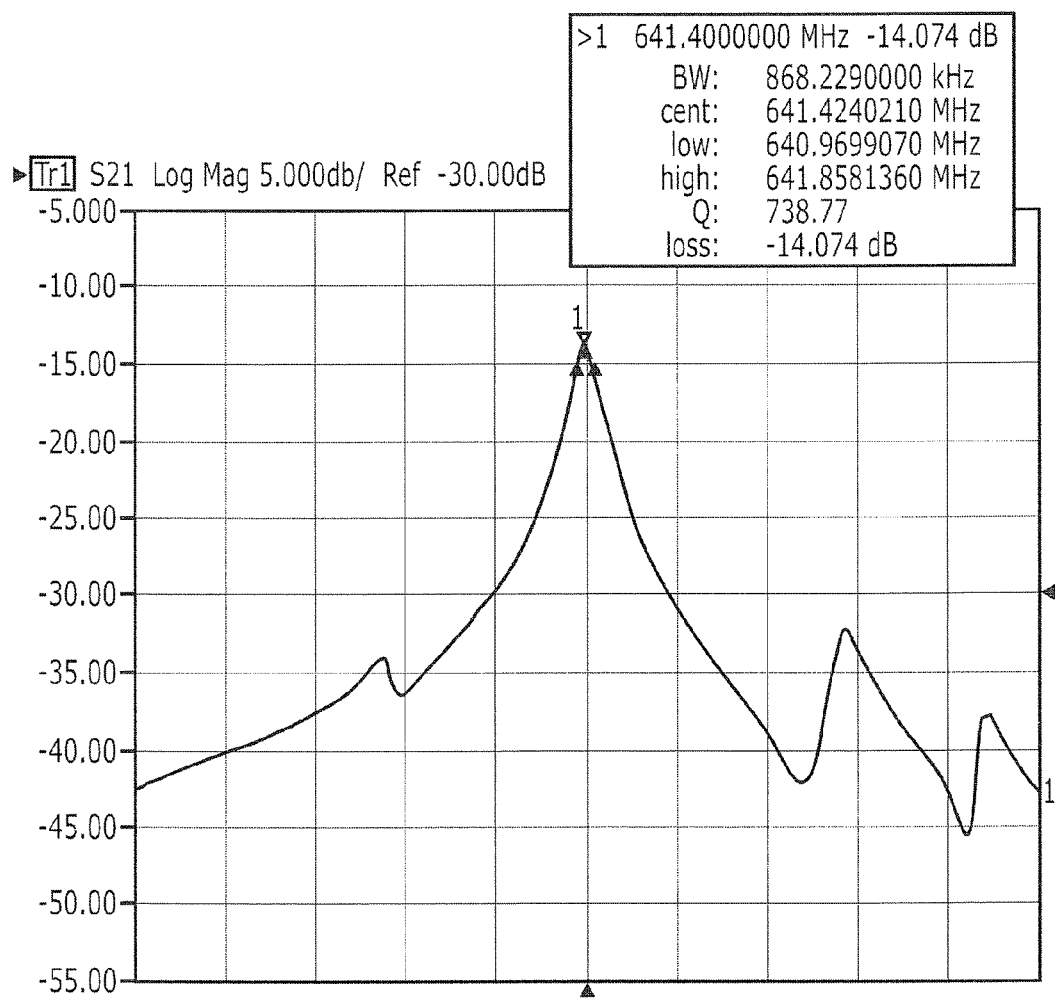
FIG. 8 is a graph showing the frequency response of a $15^{th}$ mode resonator with $L_P$=5 µm at 1 atm.

To enable higher frequency resonators, the finger pitch is reduced. A 75 µm by 80 µm composite bulk acoustic resonator 10 with $L_P$=5 µm is shown in FIG. 2. Its resonance frequency is 640 MHz and its impedance is 400 ohms (FIG. 8). Again, a linear response was observed for a 10 dBm input. The reduced Q of 740 (at atmospheric pressure) is primarily attributed to losses in the anchors 24. As the frequency and the number of electrode fingers are increased, the importance of optimizing the resonator 10 for a clean mode is escalated.

One attractive aspect is the ability to fabricate thickness mode resonators 10 next to lateral composite bulk acoustic resonators 10. A small composite thickness mode resonator 10 exhibited resonance at 2.5 GHz and quality factors of 1200

Figure 9:
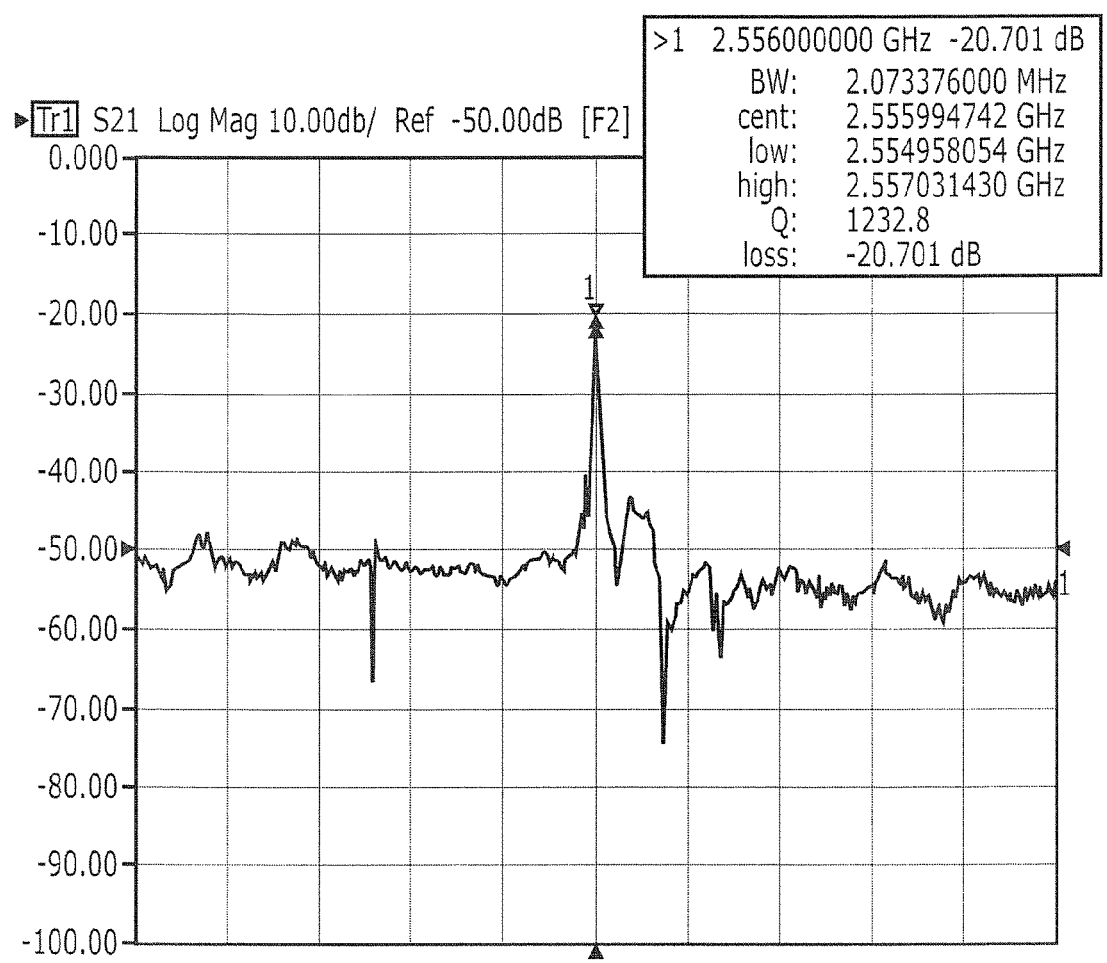
FIG. 9 is a graph showing the frequency response of a thickness mode resonator fabricated on the same substrate as composite bulk acoustic resonators.

(FIG. 9). Although the 1 kohm impedance of the resonator 10 is quite high, greater than 30 dB isolation is observed again. With a proper design of the thickness mode resonator, good out-of-band rejection filters could be enabled. An importance aspect of piezoelectric resonator design is mode isolation. Non-optimized lateral mode composite bulk acoustic resonators 10 show multiple peaks, corresponding to unintended extensional modes, flexural modes, and also thickness modes.

The technology disclosed herein offers a multi-standard single-chip solution that complements film bulk acoustic resonator technology. The technology disclosed herein permits implementation of combinations of filters for DVB, GSM, and WCDMA applications on the same chip in a post-CMOS process.

In addition, 1800, 1900, and 2400 MHz resonators 10 may be obtained by selectively depositing thicker metal electrode 16 for mass loading. Lower frequency resonators and filters (e.g., 900 MHz) may be obtained by the use of lateral vibration modes. Using a piezoelectric film 20 having a single thickness, a predetermined structural topology and electrode configuration excites lateral modes having a lithographically-defined frequency that differs from the higher frequency modes. Therefore, the same piezoelectric film 20 can be utilized to fabricate resonators 10 with widely-dispersed frequencies for multiple operating standards.

High-order lateral-mode UHF micromechanical piezoelectric resonators 10 with lithographically-defined frequencies are disclosed herein. In one embodiment, a piezoelectric stack 20 is deposited on top of a single crystal silicon (SCS) substrate 21. Single crystal silicon is a preferred material for fabricating the micromechanical resonator 10 since (1) Q values greater than 100,000 are possible, (2) it has an energy density three orders greater than quartz, (3) it has ideal extensional modes of resonance not found in any other materials, and (4) its material properties are stable, well-characterized and repeatable to enable design for manufacturability, and it enables a high-yield fabrication technology (described below). Finally, a piezoelectric transduction scheme is employed in lieu of capacitive transduction for its greater electromechanical coupling and enabling feature for the designs disclosed herein.

Although piezoelectric micromechanical resonators for UHF applications have been proposed for over two decades, the resonators 10 disclosed herein are superior because they preferably incorporates a single crystal silicon substrate 21 and piezoelectric films 20 that enable operational performance that has been previously unattainable. A primary aspect of the resonator 10 lies in the ability to lithographically-define its resonant frequency. The single crystal silicon substrate 20 together with the piezoelectric film 20 also enables resonator configuration and mode of operation that has superior power handling, a greater quality factor at UHF frequencies, and exceptional manufacturability. An optimized design, when integrated with electronics, is also more tunable than all existing UHF technologies.

In one embodiment, the design incorporates piezoelectric transduction to implement a high-order extensional-mode resonant structure (resonator apparatus 22) on a silicon-on-insulator (SOI) substrate 21. The resonator 10 may comprise alternative substrates 21 or the underlying substrate 21 may be removed during processing. Typically, a 1 GHz resonator 10 has a frequency-defining dimension of 4 µm. Since dimensional variation lead to frequency variations, frequency accuracy is normally difficult to obtain with geometries of this size. However, the use of a high-order mode addresses this issue. For example, the same 1 GHz resonator 10 operating in its n=50 mode has a lateral frequency-defining dimension of 200 µm. Thus, the frequency accuracy is improved by a factor of n. The optimized configuration of the resonator 10 also reduces parasitic shunt, series, and parallel elements to enable tuning.

A method disclosed below may be used to fabricate the resonator 10 and allows for integration of the resonator 10 with microelectronics devices on the same substrate 21. In the prior art, there are two types of micromachining processes that limit their use on a prefabricated substrate: high temperature processes and device release processes. Liquid and vapor forms of hydrofluoric acid (HF) are typically used to remove sacrificial and buried oxide layers during processing. Since HF degrades most materials during prolonged exposure, removal of buried oxide for a device larger than 20 µm is difficult.

In producing exemplary resonators 10, a pre-processed SOI substrate 21 having a buried cavity 19 may be used. A handle silicon layer 11 is processed to form the oxide film 12 or layer 12 thereon. A cavity 19 is then formed in the oxide film 12 or layer 12. A device silicon layer 13 is then formed on top of the oxide film 12 or layer 12 to complete the SOI substrate 11. Then, metal films 14, 16 (interdigitated electrodes 14, 16) and piezoelectric films 15 are deposited and patterned on the device silicon layer 13 that are compatible with existing thin film resonator technologies. Prior to packaging, trenches are etched through the piezoelectric stack 20 into the device silicon layer 13 to define lateral dimensions of the resonator apparatus 22. Since the buried cavity 19 is present beneath the metal films 14, 16 and piezoelectric films 15 comprising the resonator apparatus 22, the resonator apparatus 22 is fully released.

Electrode Configurations for High-Order Odd Modes

Figure 10:
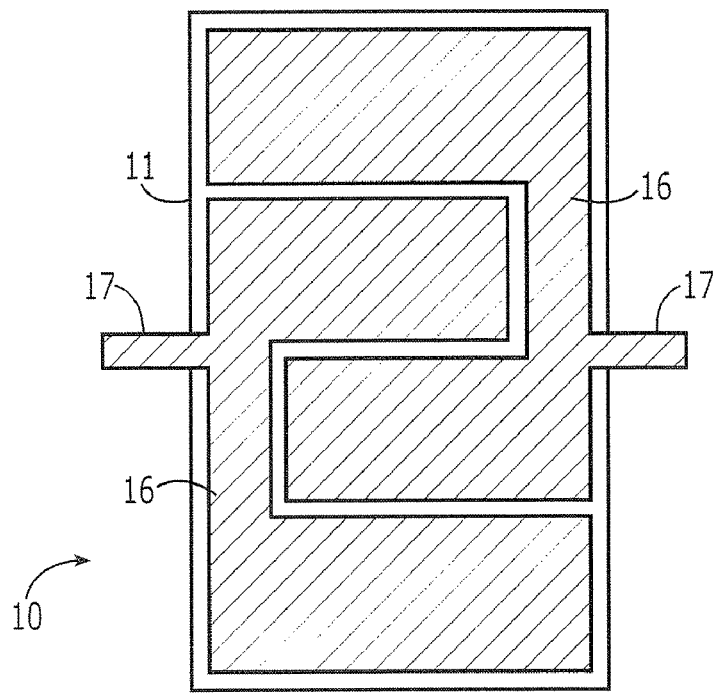
FIG. 10 is a top view of an exemplary resonator showing a first exemplary electrode configuration.
Figure 11:
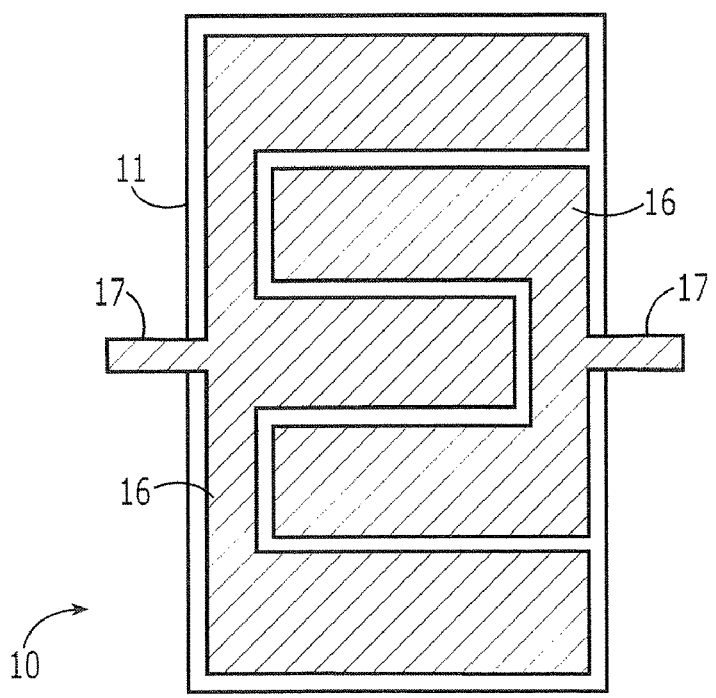
FIG. 11 is a top view of an exemplary multi-frequency resonator showing a second exemplary electrode configuration.
Figure 12:
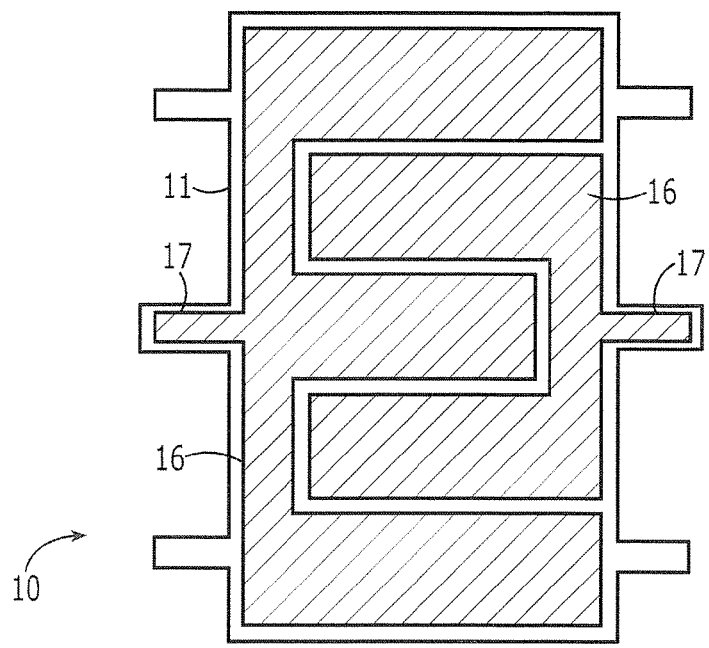
FIG. 12 illustrates an exemplary multi-support composite bulk acoustic resonator.
Figure 13:
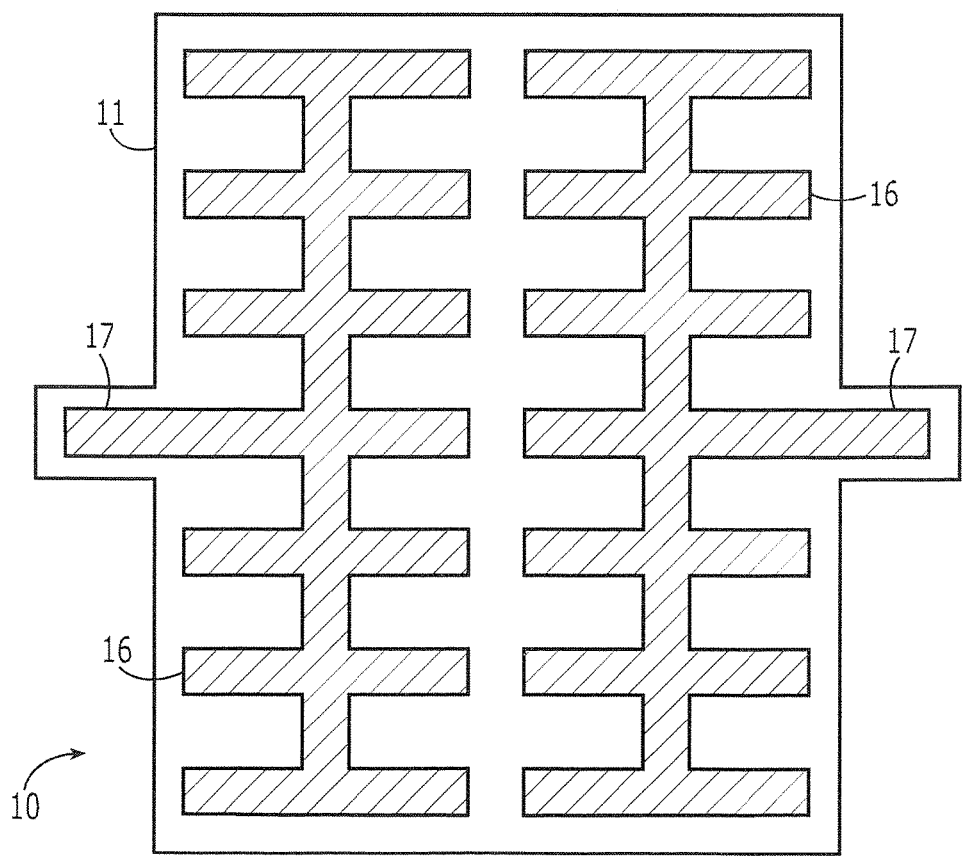
FIG. 13 illustrates an exemplary noninterdigitated composite bulk acoustic resonator.

Electromechanical coupling for high-order resonant modes of the resonator 10 may be optimized using different electrode configurations. From the strain function, it can be seen that regions with opposing phase are electrically connected using full-length electrodes interdigitated 16. Regions with different phase lead to charge cancellation. Therefore, to optimize the electromechanical coupling, the electrode configuration shown in FIGS. 10 and 11 may be used.

With this configuration, only electrode regions with equal phase are connected. Although the device is asymmetric, this is the optimized electrode configuration for a one dimensional extensional-mode block resonator 10. The electromechanical coupling coefficients are:

$$\eta_1 = N_1(2d_{31}E_P b_1), \eta_2 = N_2(2d_{31}E_P b_2),$$

where $N_1$ and $N_2$ are the number of electrode regions for the input and output electrodes, respectively. Arbitrarily defining that the input electrode area is larger, $$N_1 = (n+1)/2, N_2 = (n-1)/2.$$

Therefore, the product of the input and output electromechanical coupling coefficients for this interdigitated electrode configuration is:

$$\eta_1 \eta_2 = (\eta_1 \eta_2)_{INTERDIG} = (n^2-1)(d_{31}E_P w)^2.$$

$\eta = d_{31}E_P w$ for full-length half-width interdigitated electrodes 14, 16, and $(\eta_1 \eta_2)_{full} = (d_{31}E_P W)^2$.

The advantage in using the interdigitated electrodes 14, 16 is evident in the motional resistances:

$$\frac{R_{xINTERDIG}}{R_{xFULL}} = \frac{(\eta_1\eta_2)_{FULL}}{(\eta_1\eta_2)_{INTERDIG}} = \frac{1}{n^2-1}.$$

Using the new electrode configuration, the motional resistances are reduced by a factor of $n_2-1$ and can be expressed in terms of design parameters:

$$R_x = \frac{n\pi h\sqrt{E_P}}{2Q(n-1)d\frac{2}{31}E\frac{2}{P}w}$$

This equation shows that the motional resistance decreases as a function of mode number, $R_x(n)\alpha n/(n^2-1)$. This is the case only because motional current increases with frequency. If the mechanical response from the input voltage is compared, then $$Z(s)/V_1(s) = \eta_1 M(s).$$

Thus, improved micromechanical resonators have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. A micromechanical resonator operable in a bulk acoustic mode, comprising:
    a resonator apparatus suspended over a substrate, said resonator apparatus comprising a composite of a device layer and a piezoelectric stack on the device layer, said piezoelectric stack comprising a conductive metal layer on the device layer, a piezoelectric layer on the conductive metal layer and a plurality of interdigitated electrodes on the piezoelectric layer.

2. The micromechanical resonator of claim 1, wherein said resonator apparatus is anchored to the substrate by a plurality of anchors.

3. The micromechanical resonator of claim 2, wherein each of the plurality of interdigitated electrodes extends across a respective one of the plurality of anchors.

4. The micromechanical resonator of claim 3, further comprising:
    an excitation port on the substrate, electrically connected to a first one of the plurality of interdigitated electrodes; and
    a sense port on the substrate, electrically connected to a second one of the plurality of interdigitated electrodes.

5. The micromechanical resonator of claim 3, wherein said resonator apparatus is suspended over a cavity in the substrate; and wherein said resonator apparatus comprises an electrically insulating layer on a bottom surface of the device layer that faces the cavity.

6. The micromechanical resonator of claim 1, wherein a pitch between said plurality of interdigitated electrodes is uniform.

7. The micromechanical resonator of claim 1, wherein the device layer is a single crystal silicon device layer.

8. The micromechanical resonator of claim 1, wherein the device layer comprises a material selected from a group consisting of diamond, nanocrystalline diamond, silicon carbide, silicon-germanium and gallium arsenide.

9. The micromechanical resonator of claim 1, further comprising a pair of frequency-adjusting electrodes disposed adjacent opposite sides of said resonator apparatus and separated from the opposite sides by respective capacitive gaps.

10. The micromechanical resonator of claim 1, wherein the piezoelectric layer comprises zinc oxide.

11. The micromechanical resonator of claim 1, wherein the conductive metal layer comprises a composite of a gold layer and a chromium layer.

* * * * *

UNITED STATES PATENT AND TRADEMARK OFFICE
CERTIFICATE OF CORRECTION

| | | |
|---|---|---|
| PATENT NO. | : 7,843,284 B2 | Page 1 of 1 |
| APPLICATION NO. | : 12/618368 | |
| DATED | : November 23, 2010 | |
| INVENTOR(S) | : Ayazi et al. | |

It is certified that error appears in the above-identified patent and that said Letters Patent is hereby corrected as shown below:

On Title Page:
(*) Notice: Please add -- This patent is subject to a terminal disclaimer. --

Signed and Sealed this
Fourteenth Day of June, 2011

David J. Kappos
*Director of the United States Patent and Trademark Office*